US012621969B2

(12) United States Patent
Wecker et al.

(10) Patent No.: US 12,621,969 B2
(45) Date of Patent: *May 5, 2026

(54) ELECTRONIC POWER SYSTEM AND METHOD FOR MANUFACTURING THE SAME

(71) Applicant: Danfoss Silicon Power GmbH, Flensburg (DE)

(72) Inventors: Georg Wecker, Nordborg (DK); Ole Mühlfeld, Nordborg (DK); Lars Paulsen, Nordborg (DK); Henning Ströbel-Maier, Nordborg (DK); Holger Beer, Nordborg (DK); Christopher Klaehr, Nordborg (DK); Klaus Olesen, Nordborg (DK)

(73) Assignee: DANFOSS SILICON POWER GMBH, Flensburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/226,219

(22) Filed: Apr. 9, 2021

(65) Prior Publication Data

US 2021/0227726 A1      Jul. 22, 2021
US 2022/0071066 A9      Mar. 3, 2022

Related U.S. Application Data

(63) Continuation of application No. 16/477,321, filed as application No. PCT/EP2017/084484 on Dec. 22, 2017, now Pat. No. 10,999,955.

(30) Foreign Application Priority Data

Jan. 20, 2017    (DE) .......................... 102017101126.9

(51) Int. Cl.
*H05K 7/20*          (2006.01)

(52) U.S. Cl.
CPC ..... *H05K 7/20927* (2013.01); *H05K 7/20254* (2013.01); *H05K 7/20509* (2013.01); *H05K 7/20872* (2013.01)

(58) Field of Classification Search
CPC ........... H05K 7/20254; H05K 7/20509; H05K 7/20872; H05K 7/20881; H05K 7/20927; H05K 7/20936
See application file for complete search history.

(56) References Cited

U.S. PATENT DOCUMENTS

| | | | | |
|---|---|---|---|---|
| 5,239,200 A | * | 8/1993 | Messina ................ | H01L 23/473 165/104.33 |
| 2005/0180104 A1 | * | 8/2005 | Olesen .................... | F28F 13/06 361/699 |

(Continued)

FOREIGN PATENT DOCUMENTS

| | | |
|---|---|---|
| CN | 104704312 A | 6/2015 |
| CN | 105009022 A | 10/2015 |

*Primary Examiner* — Jacob R Crum
(74) *Attorney, Agent, or Firm* — McCormick, Paulding & Huber PLLC

(57) ABSTRACT

The invention relates to an electronic power system (1) comprising at least one electronic power module (2). The electronic power module (2) comprises a base plate (3) and at least one heat generating component arranged on a first side of the base plate (3). The electronic power module (2) comprises a cooling structure (4) transporting heat away from the electronic power module (2) via a coolant that is guided by the cooling structure (4). The cooling structure (4) is arranged on a second side (5) of the base plate (3) opposite to the first side. Task of the invention is to provide an electronic power system (1) with an improved cooling. According to the present invention this task is solved in that the cooling structure (4) is integrally formed with the base plate (3).

19 Claims, 5 Drawing Sheets

(56)        References Cited

U.S. PATENT DOCUMENTS

| | | | |
|---|---|---|---|
| 2006/0291165 A1* | 12/2006 | Flesch ................... | H01L 23/473 |
| | | | 361/699 |
| 2007/0091570 A1 | 4/2007 | Campbell et al. | |
| 2011/0100585 A1* | 5/2011 | Hohenstein ........... | H01L 23/473 |
| | | | 165/41 |
| 2014/0376184 A1* | 12/2014 | Gohara ................. | H01L 23/473 |
| | | | 361/689 |
| 2017/0263533 A1* | 9/2017 | Koyama .............. | H01L 25/072 |

* cited by examiner

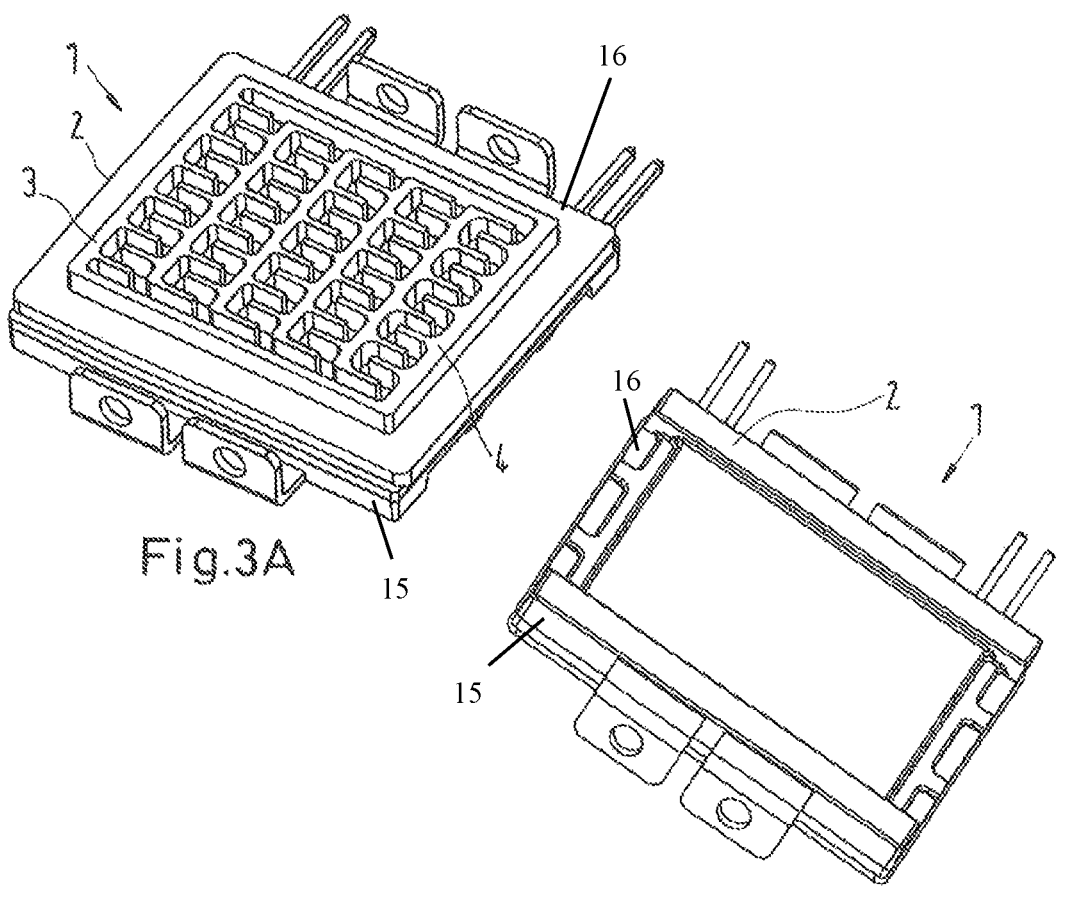
Fig.3A
Fig.3B
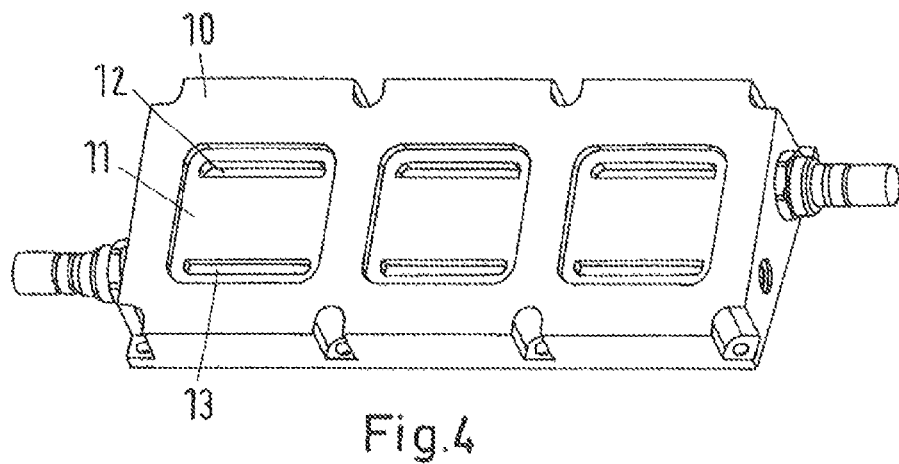
Fig.4

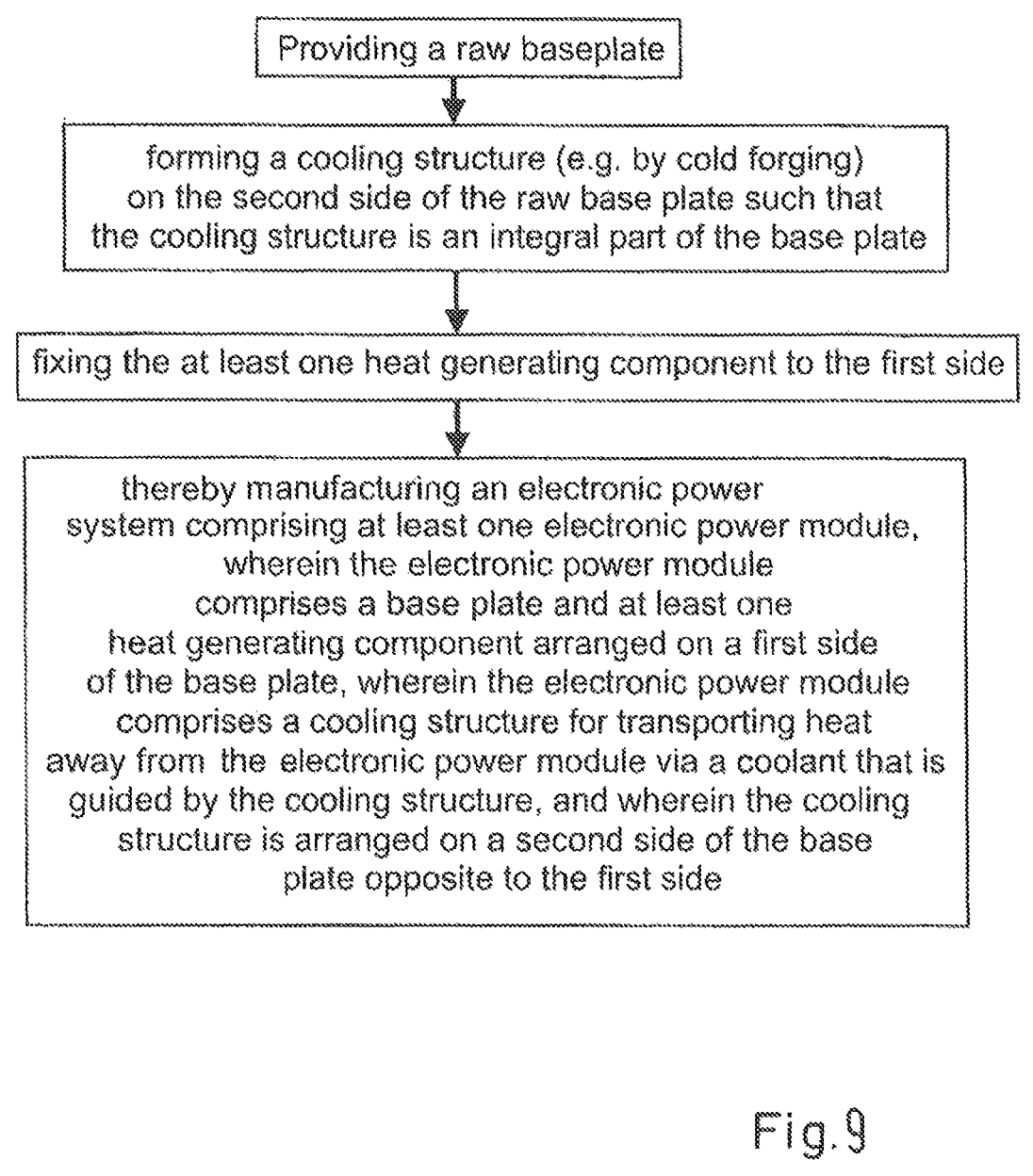

Providing a raw baseplate forming a cooling structure (e.g. by cold forging)
on the second side of the raw base plate such that
the cooling structure is an integral part of the base plate fixing the at least one heat generating component to the first side thereby manufacturing an electronic power
system comprising at least one electronic power module,
wherein the electronic power module
comprises a base plate and at least one
heat generating component arranged on a first side
of the base plate, wherein the electronic power module
comprises a cooling structure for transporting heat
away from the electronic power module via a coolant that is
guided by the cooling structure, and wherein the cooling
structure is arranged on a second side of the base
plate opposite to the first side

Fig.9

ELECTRONIC POWER SYSTEM AND METHOD FOR MANUFACTURING THE SAME

CROSS-REFERENCE TO RELATED APPLICATIONS

This application is a continuation of U.S. patent application Ser. No. 16/477,321, filed Jul. 11, 2019, which is a National Stage application of International Patent Application No. PCT/EP2017/084484 filed on Dec. 22, 2017, which claims priority to German Patent Application No. 10 2017 101 126.9 filed Jan. 20, 2017 each of which is hereby incorporated by reference in its entirety.

TECHNICAL FIELD

The invention relates to an electronic power system comprising at least one electronic power module, wherein the electronic power module comprises a base plate and at least one heat generating component arranged on a first side of the base plate, wherein the electronic power module comprises a cooling structure for transporting heat away from the electronic component via a coolant that is guided by the cooling structure, and wherein the cooling structure is arranged on a second side of the base plate opposite to the first side.

BACKGROUND

The coolant can be any of a number of different fluids known in the field. Typically, water, with or without minor additives to control corrosion or conductivity, may be used. Alternatively, a material which is designed to undergo a phase transition during the cooling cycle may be used, to form a phase-change or two-phase cooling system. Such a system is a very efficient method of cooling, and comprises some form of compressor to compress the coolant from a gas into a liquid. This liquid is led through a heat dissipation device, such as a condenser, which removes heat from the liquid, and then on to the cooling structure after it passes through an expansion device which vaporises the liquid. The evaporating liquid undergoes a phase change and absorbs heat from the cooling structure in the process. The gas is then led through the compressor and the cycle begins again.

SUMMARY

The invention furthermore relates to a method for manufacturing an electronic power module of the above kind.

Traditionally electronic power modules in electronic power systems are assembled by having a heat generating component directly or indirectly mounted on a first side of the base plate. The heat generating component is then usually encapsulated to the outside in a molding compound which also covers the rest of the first side of the base plate.

Separate members comprising cooling structures may then be attached to either or both sides of the electronic power modules to transport heat away from the electronic power module. However, this setup has several disadvantages in particular if a strong cooling is required. If a cooling structure using a coolant is attached to the second side of the base plate the coolant will be guided through the cooling structure to absorb excess heat and transport it away from the electronic power module. An efficient cooling however requires a high flow speed of the coolant which is achieved by providing the coolant at a high pressure via a pump. Due to this the electronic power module will be subject to high pressure forces that can vary due to pressure pulses caused by the pump. Consequently, the electronic power module needs to be stabilized to avoid micro fractures which is commonly achieved by using thicker base plates to prevent a premature mechanical failure of the electronic power module. This, on the other hand, increases the volume, thickness and weight of the electronic power module.

Task of the invention is therefore to provide an electronic power system with an improved cooling.

According to the present invention the above task is solved in that the cooling structure is integrally formed with the base plate.

Consequently, the base plate and the cooling structure are not separate members that are only fixed to one another during assembly, but the cooling structure is an integral part of the base plate. This way, the cooling structure can add to the stiffness of the base plate more effectively and the overall height of the combination of base plate and cooling structure may be reduced compared to the state of the art without a loss of stability of the electronic power module.

In an embodiment, the cooling structure comprises at least one wall structure for stiffening the base plate and directing a coolant along the cooling structure. Each wall structure may be a combination of wall elements connected to one another. The at least one wall structure can also guide the flow of coolant from at least one cooling structure inlet to at least one cooling structure outlet. Wall structures provide more stability and stiffening to the base plate than isolated pin-fins. In an embodiment, the at least one wall structure changes direction in the plane of the cooling structure parallel to the second surface. The change in direction may be gradually or abruptly or both at different locations of the wall structure. In other words, parts of the wall structure may be straight and other parts may, for example, be curved.

In an embodiment, one of the wall structures comprises at least one stabilizing wall element, wherein the stabilizing wall element does change direction for at least one third of the extension of the base plate along that direction. This embodiment ensures that at least part of the at least one wall structure adds significantly to the stiffness and stability of the base plate. If the cooling structure comprises several stabilizing wall elements of this kind then the stiffness of the whole base plate will approach that of a massive base plate of the same thickness. In an embodiment, the at least one stabilizing wall element does not change direction for at least one half of the extension of the base plate along that direction. In an embodiment, at least one stabilizing wall element does not change direction for the full extension of the base plate along that direction.

In an embodiment, the electronic power system comprises at least two stabilizing wall elements that are arranged at a relative angle between 60° and 120°. This embodiment ensures that at least two stabilizing wall elements are arranged nearly perpendicular in the plane of the cooling structure and thereby ensure a sufficient overall stiffness and stability of the base plate.

In an embodiment, the cooling structure is limited in the plane of the cooling structure by at least three stabilizing wall elements. Depending on the shape of base plate a number of stabilizing wall elements may thus limit the cooling structure and thus the flow of coolant in the plane of the cooling structure. The base plate may be rectangular in which case the cooling structure may be limited by four stabilizing wall elements which meet in the corners of the cooling structure.

In an embodiment, the cooling structure comprises at least two wall structures that form an interleaved comb pattern for guiding the flow of the coolant along the cooling structure and stabilizing the base plate. An interleaved comb pattern is effective at providing both an uniform cooling and a high stiffness of the base plate. The interleaved comb pattern may be formed between two neighboring stabilizing wall elements. The neighboring stabilizing wall elements may run parallel but can also be arranged at an angle relative to one another.

In an embodiment, the cooling structure comprises both wall structures and transversally isolated pins. The cooling structure may furthermore comprise pins which are connected to at least one of the wall structures.

In an embodiment, the cooling structure comprises at least three wall structures each of which comprises at least one stabilizing wall element, wherein the at least three stabilizing wall elements extend radially towards a common center location. The common center location does not necessarily need to be arranged in the geometrical center of the base plate. In case the base plate has a certain symmetry it may, however, be advantageous to arrange the common center location in the geometrical center of the plane of the cooling structure. Arranging at least three stabilizing wall elements in a radial arrangement towards a common center location provides a high stability to the base plate. Furthermore, in this embodiment the cooling structure inlet may be arranged above the common center location such that the center of the base plate receives the strongest cooling. The latter may be desirable in applications where the most heat is produced in the center of the electronic power module. The cooling structure may in this embodiment comprise further, non-radially arranged stabilizing wall elements.

In an embodiment, the wall structures form a polar comb pattern between neighboring stabilizing wall elements around the common center location. In this embodiment, the flow of the coolant may then enter the cooling structure near the common center location and then flow radially outwards meandering through the polar comb pattern arranged between neighboring stabilizing wall elements until it reaches the cooling structure outlet.

In an embodiment, the electronic power system comprises at least two electronic power modules and a common coolant distributor, wherein the common coolant distributor comprises at least one distributor inlet and at least one distributor outlet connected to each electronic power module. Each distributor inlet may be connected to one or more cooling structure outlets and each distributor outlet may be connected to one or more cooling structure inlets and vice versa.

In an embodiment, the common coolant distributor comprises individual depressions for receiving each electronic power module, wherein each depression comprises at least one distributor inlet and at least one distributor outlet.

The above task is also solved by a method for manufacturing an electronic power system comprising at least one electronic power module, wherein the electronic power module comprises a base plate and at least one heat generating component arranged on a first side of a base plate, wherein the electronic power module comprises a cooling structure for transporting heat away from the electronic power module via a coolant that is guided by the cooling structure, and wherein the cooling structure is arranged on a second side of the base plate opposite to the first side, comprising the steps:

Providing a raw base plate,
  forming a cooling structure on the second side of the raw base plate such that the cooling structure is an integral part of the base plate,
  fixing the at least one heat generating component to the first side.

In an embodiment, the cooling structure is formed by cold forging the raw base plate. The cooling structure may, for example, be stamped into the raw base plate. Depending on the material of the base plate cold forging may be more cost efficient than other methods of manufacture. Alternatively, the cooling structure may be formed by hot forging, etching, milling, 3D printing, additive manufacturing, sintering, injection molding, casting or eroding. These alternative methods may be used in particular if the material of the base plate is not suitable for cold forging or if the shape of the cooling structure is difficult to achieve by cold forging.

BRIEF DESCRIPTION OF THE DRAWINGS

Preferred embodiments of the invention will now be described with reference to the figures, wherein:

FIG. 4 shows a common coolant distributor as part of an electronic power system according to the invention, FIG. 9 shows a flow diagram of the method of manufacture according to the invention.

DETAILED DESCRIPTION

Figure 1:
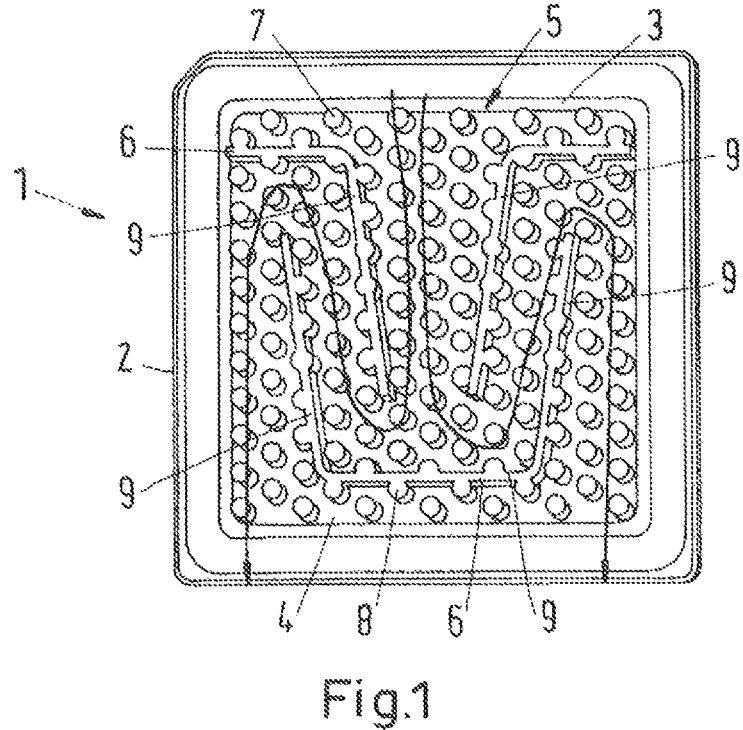
FIG. 1 shows a top view of an electronic power module as part of an electronic power system according to the invention.

FIG. 1 shows a simplified depiction of an electronic power system 1 according to a first embodiment of the invention. The electronic power system 1 comprises an electronic power module 2 having a base plate 3. The electronic power module 2 furthermore comprises a heat generating component arranged on a first side of a base plate 3, which is not visible from the shown angle. The electronic power module 2 furthermore comprises a cooling structure 4 which is arranged on a second side 5 of the base plate 3.

The cooling structure 4 is integrally formed with the base plate 3. Both may be manufactured from a common raw base plate, for example, by cold forging. Alternatively, the cooling structure 4 may also be formed by hot forging, etching, milling, 3D printing, additive manufacturing, sintering, injection molding, casting or eroding.

In this embodiment the cooling structure 4 comprises three wall structures 6 as well as transversally isolated pins 7. Furthermore, some pins 8 are connected to wall structures 6.

FIG. 1 furthermore shows the two main flow directions of a coolant starting from the top downwards and then following approximate channels formed by the wall structures 6.

The electronic power system 1 may, of course, comprise a plurality of electronic power modules 2 which may be provided with a coolant by a common coolant distributor as will be shown in one of the later embodiments.

The wall structures 6 here comprise each at least one stabilizing wall element 9 that does not change direction at least one third of the extension of the base plate along that direction.

Figure 2:
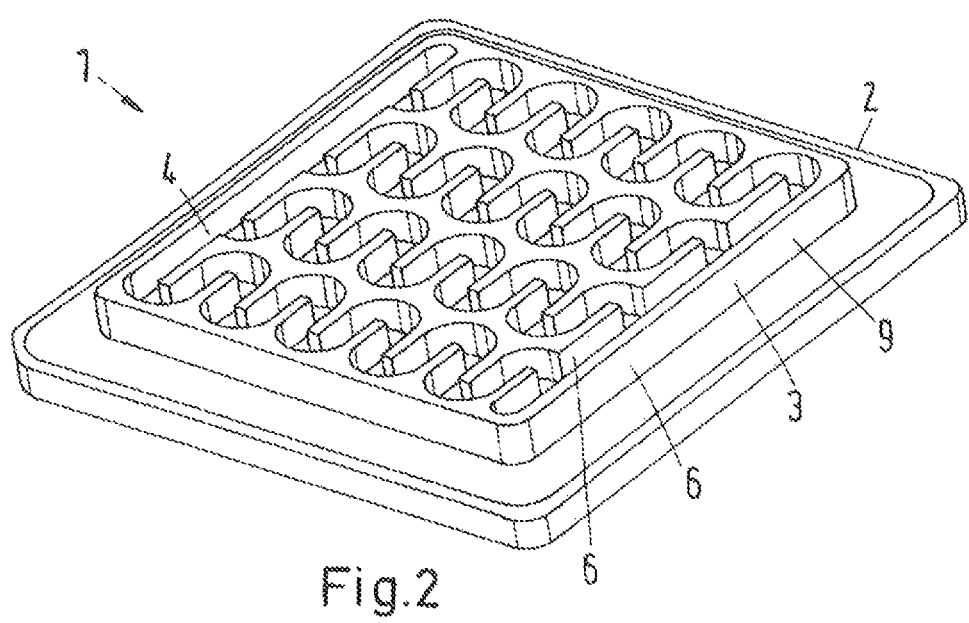
FIG. 2 shows a second embodiment of an electronic power module as part of an electronic power system according to the invention, FIGS. 3A+3B show a third embodiment of an electronic power module as part of an electronic power system according to the invention.

FIG. 2 shows a second embodiment of an electronic power system 1 according to the invention. The electronic power module 2 here again comprises a base plate 3 having a different cooling structure 4 compared to the previous embodiment. Here, the cooling structure 4 comprises four wall structures 6. One of the wall structures 6 comprises four stabilizing wall elements 9 which limit the cooling structure 4 in the transversal plane. The other wall structures 6 are arranged inside the limiting wall structure 6. The wall structures 6 form an interleaved comb pattern for guiding the flow of the coolant along the cooling structure 4. In this embodiment all wall elements are arranged either parallel or perpendicular to one another.

FIGS. 3a and 3b show a similar embodiment to FIG. 2. Here, the electronic power module 2 is shown from the second side in FIG. 3a and from the first side of the base plate 3 in FIG. 3b with a molding compound 15 and baseplate 16.

In FIG. 4 a common coolant distributor 10 for three electronic power modules 2 according to FIGS. 3a and 3b is shown. The common coolant distributor 10 comprises three depressions 11 each arranged to accommodate a cooling structure 4 of an electronic power module 2. In each depression 11 one distributor inlet 12 and one distributor outlet 13 is arranged.

Figure 5:
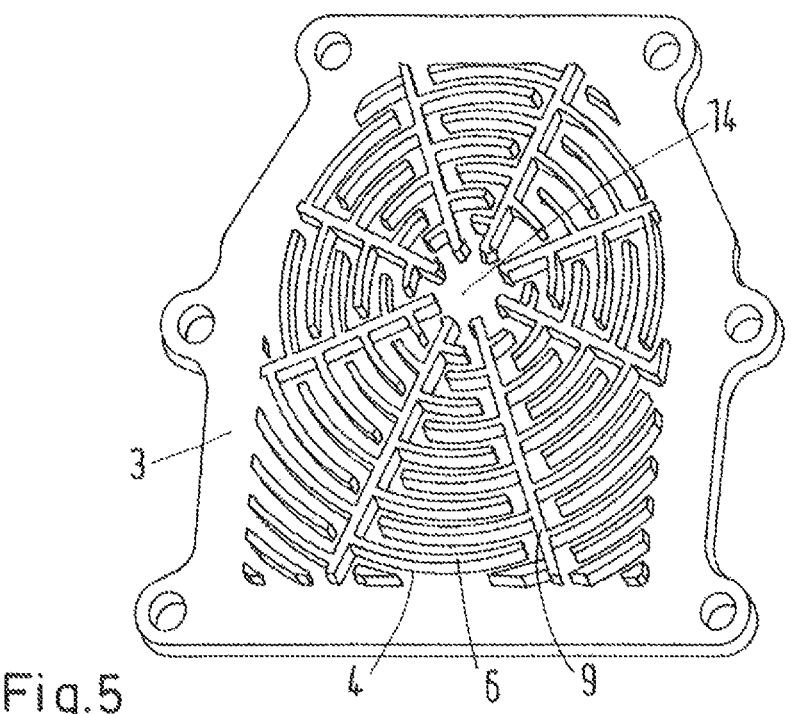
FIG. 5 shows a fourth embodiment of a base plate of an electronic power system according to the invention.

FIG. 5 shows a fourth embodiment of a base plate 3 for an electronic power system 1. The other parts of the electronic power module 2 and the electronic power system 1 are omitted for simplicity. The base plate 3 here again comprises a cooling structure 4. The cooling structure 4 here comprises eight wall structures 6. The wall structures 6 each comprise one stabilizing wall element 9 that runs towards a common center location 14. For each stabilizing wall element 9 there is one other stabilizing wall element 9 that runs parallel and two other stabilizing wall elements 9 that run perpendicular. The wall structures 6 form a polar comb pattern between neighboring stabilizing wall elements 9 around the common center location 14.

Figure 6:
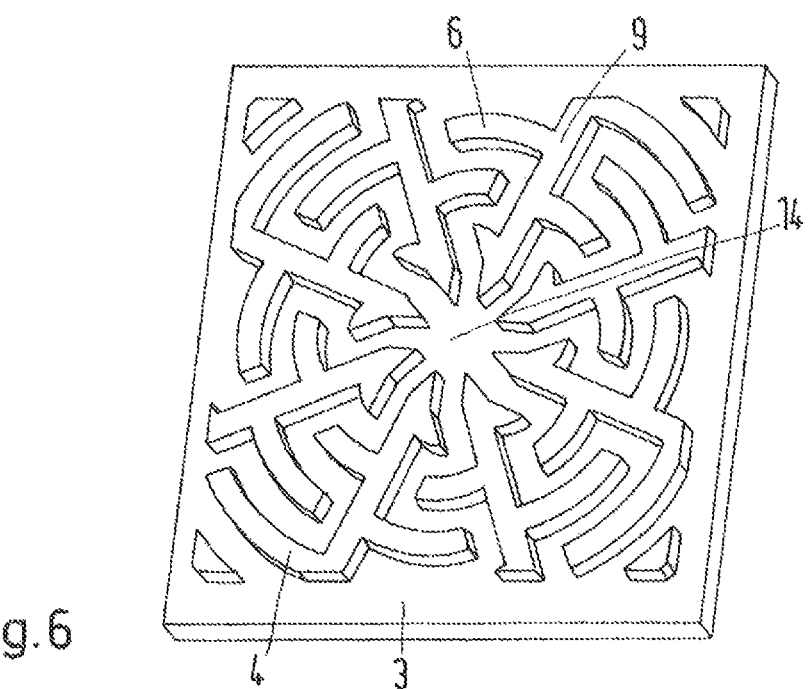
FIG. 6 shows a fifth embodiment of a base plate as part of an electronic power system according to the invention.

FIG. 6 shows a fifth embodiment according to the invention. The base plate 3 here comprises a cooling structure 4 that has a similar radial geometry to the embodiment according to FIG. 5. The main difference in this case is that the base plate 3 as well as the cooling structure 4 has a rectangular shape in the plane of the cooling structure 4.

Figure 7:
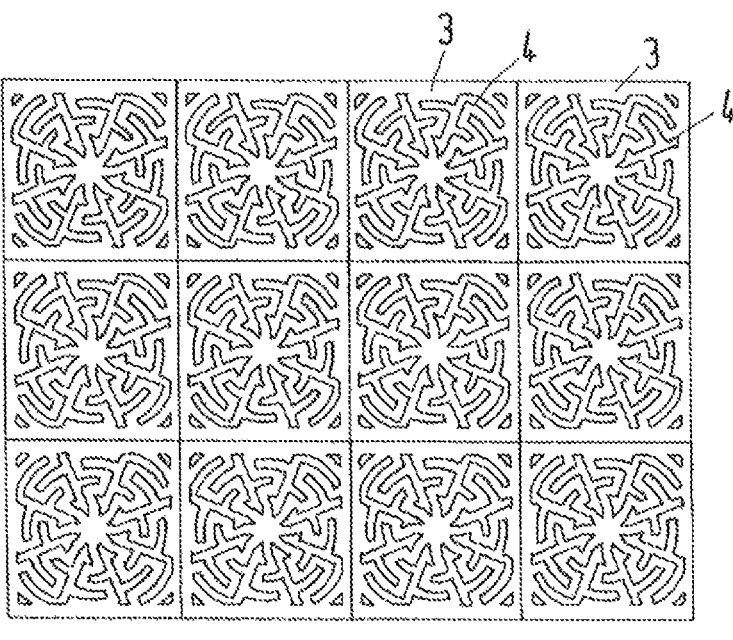
FIG. 7 shows an arrangement of twelve adjacent base plates according to the embodiment of FIG. 6.

FIG. 7 shows an arrangement of twelve base plates 3 according to the embodiment of FIG. 6 arranged adjacent to one another. All other elements of the electronic power modules 2 are again omitted for simplicity.

Figure 8:
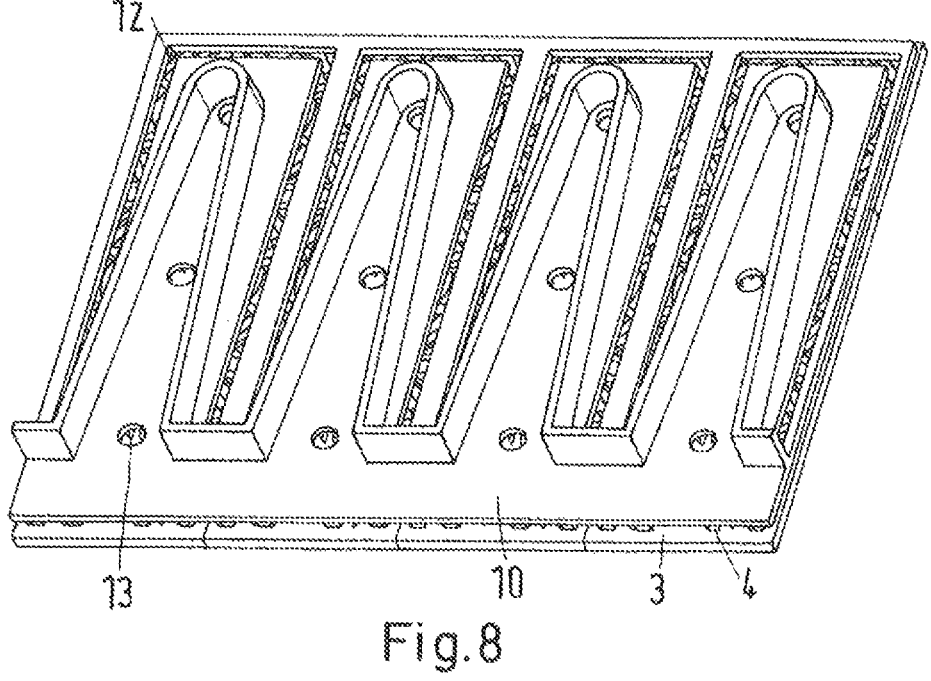
FIG. 8 shows the embodiment according to FIG. 7 together with a matching common coolant distributor.

FIG. 8 shows the same embodiment as FIG. 7, where in addition a common coolant distributor 10 is placed on top of the cooling structures 4 to provide the electronic power modules 2 with a coolant as well as to accept the heated coolant flowing out of the cooling structures 4. In this case, the common coolant distributor 10 provides three adjacent cooling structures 4 with coolant through three neighboring distributor outlets 13. The distributor outlets 13 are here arranged such that the cold coolant enters the cooling structures 4 at the common center location 14 of each of the cooling structures 4. The heated coolant then exits the cooling structures 4 at the distributor inlet 12. Here, each distributor inlet 13 is connected to several adjacent cooling structures 4 of adjacent electronic power modules 2.

FIG. 9 shows a flow diagram of the method of manufacture according to the invention. According to the method a raw base plate is first provided. Then the cooling structure 4 is formed on the second side of the raw base plate such that the cooling structure 4 is an integral part of the base plate 3. This forming process may for example be carried out by cold forging. Alternatively, the cooling structure 4 may also be formed by hot forging, etching, milling, 3D printing, additive manufacturing, sintering, injection molding, casting or eroding.

Then the at least one heat generating component is fixed to the first side of the base plate. Thereby an electronic power system 1 comprising at least one electronic power module 2 is manufactured. The electronic power module comprises a base plate and at least one heat generating component arranged on a first side of the base plate 3. The electronic power module 2 comprises a cooling structure 4 for transporting heat away from the electronic power module 2 via a coolant that is guided by the cooling structure 4. The cooling structure 4 is arranged on a second side 5 of the base plate 3 opposite to the first side.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. An electronic power system comprising at least one electronic power module, wherein the electronic power module comprises a base plate and at least one heat generating component arranged on a first side of the base plate, wherein the electronic power module comprises a cooling structure for transporting heat away from the electronic power module via a coolant that is guided by the cooling structure, wherein the cooling structure is arranged on a second side of the base plate opposite to the first side, wherein the cooling structure is integrally formed with the base plate, wherein the cooling structure comprises at least two wall structures, wherein the wall structures are not contiguous, wherein at least one of the wall structures comprises two stabilizing wall elements, wherein the two stabilizing wall elements do not change direction for at least one third of the extension of the base plate along that direction, wherein the two wall structures are arranged such that portions of the coolant flows on opposite sides of the stabilizing wall elements of the at least two wall structures during operation; and wherein a first of the two stabilizing wall elements forms a first coolant path and a second of the two stabilizing wall elements forms a second coolant path such that a first portion of the portions of the coolant that flows on opposite sides of the first of the two stabilizing wall elements and is a different portion than a second portion of the portions of the coolant that flows on opposite sides of the second of the two stabilizing wall elements.

2. The electronic power system according to claim 1, wherein at least one of the wall structures is for stiffening the base plate and directing a coolant along the cooling structure.

3. The electronic power system according to claim 1, wherein the electronic power module comprises at least two stabilizing wall elements that are arranged at a relative angle between 60° and 120°.

4. The electronic power system according to claim 1, wherein the cooling structure is limited in a transversal plane by at least three stabilizing wall elements.

5. The electronic power system according to claim 2, wherein the cooling structure further comprises transversally isolated pins, and wherein the transversally isolated pins are isolated from the wall structures.

6. The electronic power system according to claim 1, wherein the electronic power system comprises at least two electronic power modules and a common coolant distributor, wherein the common coolant distributor comprises at least one distributor inlet and at least one distributor outlet connected to each electronic power module.

7. The electronic power system according to claim 6, wherein the common coolant distributor comprises individual depressions for receiving each electronic power module, wherein each depression comprises at least one distributor inlet and at least one distributor outlet.

8. The electronic power system according to claim 3, wherein the cooling structure is limited in a transversal plane by at least three stabilizing wall elements.

9. The electronic power system according to claim 1, wherein the cooling structure further comprises transversally isolated pins, and wherein the transversally isolated pins are isolated from the wall structures.

10. The electronic power system according to claim 1, wherein at least one of the wall structures is not contiguous with a limiting side wall of the base plate.

11. An electronic power system comprising at least one electronic power module, wherein the electronic power module comprises a base plate and at least one heat generating component arranged on a first side of the base plate, wherein the electronic power module comprises a cooling structure for transporting heat away from the electronic power module via a coolant that is guided by the cooling structure, the cooling structure including wall structure that limits the cooling structure in a transverse plane and the coolant being guided by the cooling structure, wherein the cooling structure is arranged on a second side of the base plate opposite to the first side, wherein the cooling structure is integrally formed with the base plate, wherein the cooling structure comprises at least two wall structures that are not contiguous, and wherein the at least two wall structures form an interleaved comb pattern for guiding the flow of the coolant, the interleaved comb pattern being formed between two neighboring stabilizing wall elements of the at least two wall structures, the two neighboring stabilizing wall elements each do not change direction for at least one third of the extension of the base plate along that direction;

wherein the two neighboring stabilizing wall elements each extend in a direction from an inlet side of the cooling structure to an outlet side of the cooling structure, the inlet side of the cooling structure being where the coolant is arranged to enter the cooling structure and the outlet side of the cooling structure being where the coolant is arranged to exit the cooling structure, the cooling structure including the wall structure that limits the cooling structure in the transverse plane.

12. The electronic power system according to claim 11, wherein the two neighboring stabilizing wall elements run parallel to each other.

13. The electronic power system according to claim 11, wherein the two neighboring stabilizing wall elements each do not change direction for at least one half of the extension of the base plate along that direction.

14. The electronic power system according to claim 11, wherein all wall elements are arranged either parallel or perpendicular to each other.

15. The electronic power system according to claim 11, wherein the electronic power system comprises at least two electronic power modules and a common coolant distributor, and wherein the common coolant distributor comprises at least one distributor inlet and at least one distributor outlet connected to each electronic power module.

16. The electronic power system according to claim 15, wherein the common coolant distributor comprises individual depressions for receiving each electronic power module, and wherein each depression comprises at least one distributor inlet and at least one distributor outlet.

17. A method for manufacturing an electronic power system comprising at least one electronic power module, wherein the electronic power module comprises a base plate and at least one heat generating component arranged on a first side of the base plate, wherein the electronic power module comprises a cooling structure for transporting heat away from the electronic power module via a coolant that is guided by the cooling structure, and wherein the cooling structure is arranged on a second side of the base plate opposite to the first side, comprising the steps:

providing a raw base plate, forming a cooling structure on the second side of the raw base plate such that the cooling structure is an integral part of the base plate, fixing the at least one heat generating component to the first side, wherein the cooling structure comprises at least two wall structures, wherein the at least two wall structures are not contiguous, and the cooling structure including wall structure that limits the cooling structure in a transverse plane and the coolant being guided by the cooling structure, wherein the at least two wall structures form an interleaved comb pattern for guiding the flow of the coolant, the interleaved comb pattern being formed between two neighboring stabilizing wall elements of the at least two wall structures, the two neighboring stabilizing wall elements each do not change direction for at least one third of the extension of the base plate along that direction, and wherein the two neighboring stabilizing wall elements each extend in a direction from an inlet side of the cooling structure to an outlet side of the cooling structure, the inlet side of the cooling structure being where the coolant is arranged to enter the cooling structure and the outlet side of the cooling structure being where the coolant is arranged to exit the cooling structure, the cooling structure including the wall structure that limits the cooling structure in the transverse plane.

18. The method according to claim 17, wherein the cooling structure is formed by cold forging the raw base plate.

19. The method according to claim 17, wherein the two neighboring stabilizing wall elements each do not change direction for at least one half of the extension of the base plate along that direction.

* * * * *